US011133578B2

(12) United States Patent
Kamphuis et al.

(10) Patent No.: US 11,133,578 B2
(45) Date of Patent: Sep. 28, 2021

(54) SEMICONDUCTOR DEVICE PACKAGE COMPRISING AN ENCAPSULATED AND CONDUCTIVELY SHIELDED SEMICONDUCTOR DEVICE DIE THAT PROVIDES AN ANTENNA FEED TO A WAVEGUIDE

(71) Applicant: NXP B.V., Eindhoven (NL)

(72) Inventors: Antonius Hendrikus Jozef Kamphuis, Lent (NL); Antonius Johannes Matheus de Graauw, Haelen (NL); Adrianus Buijsman, Nijmegen (NL); Michael B. Vincent, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/563,292

(22) Filed: Sep. 6, 2019

(65) Prior Publication Data

US 2021/0075081 A1 Mar. 11, 2021

(51) Int. Cl.
*H01Q 1/32* (2006.01)
*H01L 23/66* (2006.01)
*H01P 5/107* (2006.01)
*H01Q 1/22* (2006.01)
*H01Q 13/20* (2006.01)
*H01P 5/103* (2006.01)
*H01P 3/12* (2006.01)

(52) U.S. Cl.
CPC ............ *H01Q 1/3233* (2013.01); *H01L 23/66* (2013.01); *H01P 3/121* (2013.01); *H01P 5/103* (2013.01); *H01P 5/107* (2013.01); *H01Q 1/2283* (2013.01); *H01Q 13/20* (2013.01)

(58) Field of Classification Search
CPC .......... H01P 5/107; H01P 5/103; H01P 3/121; H01Q 1/2283; H01Q 1/3233; H01Q 13/20
USPC ........................................... 333/26
See application file for complete search history.

(56) References Cited

U.S. PATENT DOCUMENTS 5,912,598 A   6/1999 Stones et al.
6,958,662 B1  10/2005 Salmela et al.
(Continued)

FOREIGN PATENT DOCUMENTS

KR          101677270 B1   11/2016

OTHER PUBLICATIONS

De Graauw et al., U.S. Appl. No. 16/415,069, filed May 17, 2019, entitled Apparatuses and Methods for Coupling a Waveguide Structure to an Integrated Circuit Package.
(Continued)

*Primary Examiner* — Benny T Lee

(57) ABSTRACT

A mechanism is provided to reduce a distance of a waveguide antenna from transmit and receive circuitry in an integrated circuit device die. This distance reduction is performed by providing vertical access to radio frequency connections on a top surface of the IC device die. A cavity in the encapsulant of the package can be formed to provide access to the connections and plated to perform a shielding function. A continuous connection from the RF pads is used as a vertical interconnect. The region around the vertical interconnect can be filled with encapsulant potting material and back grinded to form a surface of the semiconductor device package. A waveguide antenna feed can be plated or printed on the vertical interconnect on the surface of the package.

20 Claims, 12 Drawing Sheets

(56) References Cited

U.S. PATENT DOCUMENTS

| | | |
|---|---|---|
| 7,276,987 B2 | 10/2007 | Koriyama |
| 9,219,041 B2 | 12/2015 | Elad et al. |
| 9,356,352 B2 * | 5/2016 | Seok et al. ........... H05K 3/4644 |
| 10,103,447 B2 | 10/2018 | Tong et al. |
| 2011/0180917 A1 | 7/2011 | Tang |
| 2013/0015544 A1 | 1/2013 | Han et al. |
| 2014/0287703 A1 * | 9/2014 | Herbsommer et al. ... H01P 5/00 455/90.2 |
| 2016/0043455 A1 | 2/2016 | Seler et al. |
| 2016/0293557 A1 * | 10/2016 | Topak et al. ........ H01L 23/5389 |
| 2019/0131250 A1 | 5/2019 | Cook et al. |

OTHER PUBLICATIONS

Vincent et al., U.S. Appl. No. 16/446,861, filed Jun. 20, 2019, entitled Package Integrated Waveguide.

* cited by examiner

US 11,133,578 B2

SEMICONDUCTOR DEVICE PACKAGE COMPRISING AN ENCAPSULATED AND CONDUCTIVELY SHIELDED SEMICONDUCTOR DEVICE DIE THAT PROVIDES AN ANTENNA FEED TO A WAVEGUIDE

BACKGROUND

Field

This disclosure relates generally to millimeter-wave (mm-Wave) integrated circuits (e.g., integrated circuits (ICs) for automotive radar systems and high-speed communication systems), and more specifically, to incorporating a waveguide and antenna feed in a top surface of the integrated circuit package, thereby reducing the footprint of the package, lowering signal losses between the integrated circuit and antenna feed, and lowering cost of a printed circuit board on which the IC package is mounted.

Related Art

Radar sensors and high frequency radio devices (e.g., 5G-NR ($5^{th}$ Gen—New Radio) and WiGig (60 GHz WiFi)) play a significant role in development of automated and autonomous driving concepts and applications. These devices can require several antennas for transmitting and detecting signals, along with a high degree of signal sensitivity. These antennas and the associated semiconductor device packages can consume significant area on circuit boards. Automotive radar sensor and high-speed communication device usage is expected to continue to grow in the coming years, as is the need to reduce size and increase sensitivity of such integrated circuit devices.

Generating sufficient power to transmit and providing required sensitivity to detect signals of millmeter-wave (mmWave or W-band) systems is limited by various semiconductor device constraints, including available area and signal degradation over distance. In order to minimize power loss due to transmission lines from transmit and receive circuitry in a device die, a variety of techniques have been used to reduce the distance of the waveguide antennas from the circuitry. Historically, one or more waveguide antennas have been mounted on PCBs associated with the radar integrated circuits, and then the antenna feeds were moved closer to the circuitry by incorporating them on the periphery of the integrated circuit package.

But given that higher performance mmWave systems require minimum energy loss to the antennas, as well as a significant degree of isolation between the antennas, it is desirable to provide a package that minimizes the distance from the transmit/receive circuitry to the antennas.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION OF THE INVENTION

Embodiments of the present invention are configured to reduce a distance of a waveguide antenna from transmit and receive circuitry in an integrated circuit (IC) device die. Embodiments provide this reduction by providing vertical access to radio frequency (RF) connections on a top surface of the IC device die. A cavity in the encapsulant of the package can be formed to provide access to the connections and plated to perform a shielding function. A continuous connection from the RF pads is used as a vertical interconnect. The region around the vertical interconnect can be filled with encapsulant potting material and back grinded to form a surface of the semiconductor device package. A waveguide antenna feed (e.g., an antenna launcher) can be plated or printed on the vertical interconnect on the surface of the package. Such a mmWave package can be produced in a variety of package type, including, for example, a multi-row quad-flat no-leads (QFN) in a strip or ball grid array packages. Embodiments of the production flow can produce high quality reliability packaged devices.

In order to minimize power loss due to transmission lines from transmit and receive circuitry in a semiconductor device die to antenna structures, a variety of techniques have been used to reduce distance between the antennas and the circuitry, as well as a number of connections between different conductors in the path. Historically, waveguide antenna feeds were mounted on PCBs and the transmission lines were in both an integrated circuit (IC) mounted on the PCB as well, and in the PCB. Then the antenna feeds were moved closer to the circuitry by incorporating them on the periphery of an integrated circuit package and mounting the waveguide antenna on both the package and the PCB on which the IC was mounted. Embodiments of the present invention move antenna feeds for the waveguide antennas even closer—by positioning the antenna feeds directly above the IC in the package—thereby minimizing a distance between transmission circuitry and the antenna structures.

Figure 1:
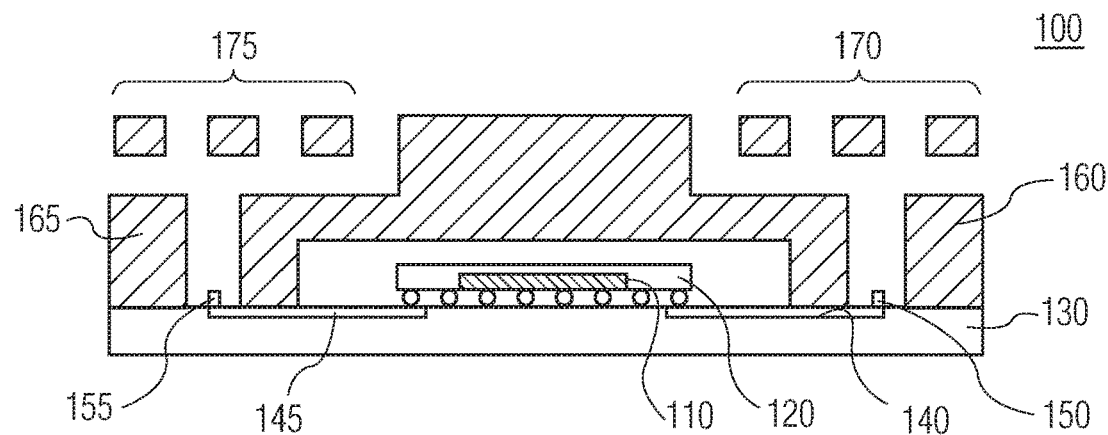
FIG. 1 is a simplified block diagram illustrating an example of a cross-section of a high frequency RF semiconductor device including a semiconductor device package mounted on a PCB with antenna feeds mounted on the PCB external to the semiconductor device package.

FIG. 1 is a simplified block diagram illustrating an example of a cross-section of a high frequency RF semiconductor device 100 including a semiconductor device package mounted on a PCB with antenna feeds mounted on the PCB external to the semiconductor device package. A semiconductor device die 110 is incorporated in a semiconductor device package 120 that is mounted on a PCB 130. PCB 130 includes traces 140 and 145 that electrically couple semiconductor device package 120 to antenna feeds 150 and 155. Antenna feeds 150 and 155 are associated with waveguide antennas 160 and 165, respectively. Waveguides 160 and 165 are associated with a receive antenna array 170 and a transmit antenna array 175, respectively.

FIG. 1 illustrates one of the drawbacks of high frequency RF semiconductor device 100, in that signal transmission lines to antenna feeds 150 and 155 require not only signal lines from device die 110 to signal contacts of semiconductor device package 120, but also providing that signal along PCB traces 140 and 145 through electronic coupling, such as solder balls. High-frequency signals provided over such distances can suffer degradation resulting in a loss of sensitivity and power.

Figure 2:
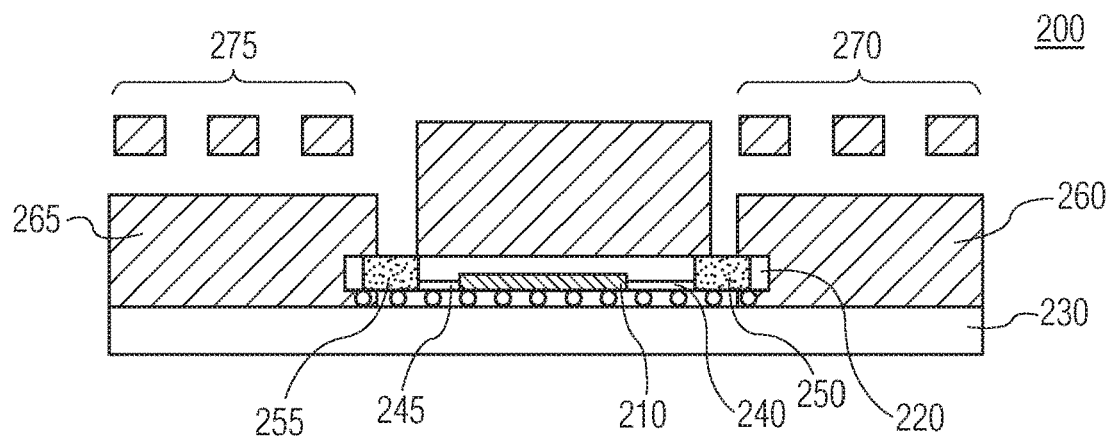
FIG. 2 is a simplified block diagram illustrating an example of a cross-section of a high frequency RF semiconductor device that provides antenna feeds on a semiconductor device package.

FIG. 2 is a simplified block diagram illustrating an example of a cross-section of a high frequency RF semiconductor device 200 that improves sensitivity and power associated with transmission and reception of high-frequency signals by providing antenna feeds on a semiconductor device package. A semiconductor device die 210 is incorporated in a semiconductor device package 220 that is mounted on a PCB 230. Within semiconductor device package 220 are traces 240 and 245 coupling circuitry within semiconductor device die 210 to antenna feed structures 250 and 255. Antenna feed structures 250 and 255 are incorporated within semiconductor device package 220, thereby reducing signal path length from circuitry within semiconductor device die 210 to the distance to the periphery of semiconductor device package 220, and eliminating the solder balls from the signal path. Antenna feeds 250 and 255 are associated with waveguide structures 260 and 265, respectively, which are in turn associated with a receive antenna array 270 and a transmission antenna array 275, respectively. The waveguide structures are mounted on both semiconductor device package 220 and PCB 230.

While high-frequency RF semiconductor device 200 improves performance over semiconductor device 100 by reducing signal length, higher transmit power and receive sensitivity requirements for current devices exceed that which such structures can provide. In part, this is due to signal losses inherent in interconnect transmission lines due to length of transmission lines and number of transmission line interfaces that become especially relevant at higher frequencies (e.g., mmWave), such as increased conductive losses (e.g., skin-effect) and increased dielectric losses (e.g., loss tangent). Thus, a solution for providing even shorter signal paths is provided by embodiments of the present invention.

Figure 3A:
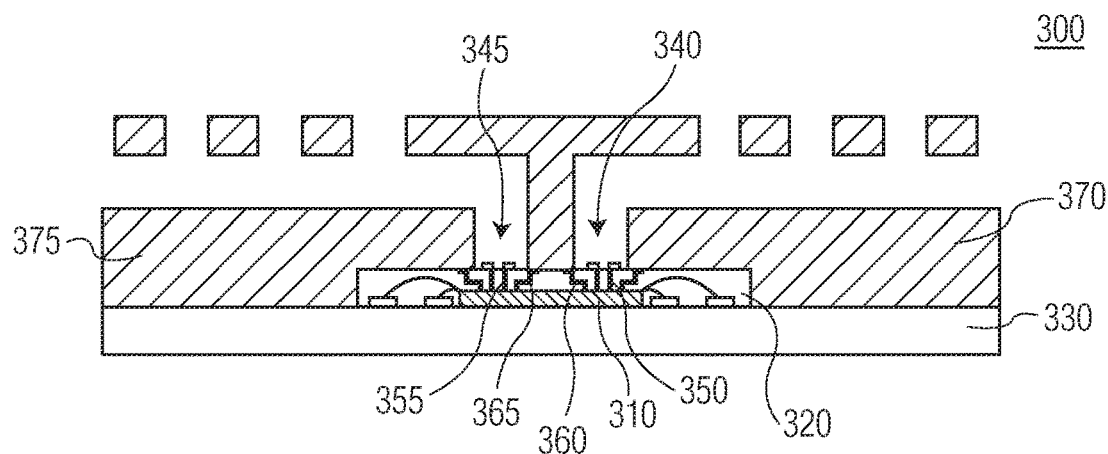
FIG. 3A is a simplified block diagram illustrating a cross-section of an example high-frequency RF semiconductor device that provides antenna feeds on the semiconductor package in a region directly above the semiconductor device die incorporated within that package thereby providing a shortest distance from the RF circuitry to the antenna structures.

FIG. 3A is a simplified block diagram illustrating a cross-section of an example high-frequency RF semiconductor device 300 that improves sensitivity associated with transmission and reception of high frequency signals by providing antenna feeds on the top surface of semiconductor package in a region directly above the semiconductor device die incorporated within that package thereby providing a shortest distance from the RF circuitry to the antenna structures. Embodiments further seek to reduce a number of interconnections between transmit and receive circuitry and the antenna feeds to improve signal power.

A semiconductor device die 310 is incorporated in semiconductor device package 320 mounted on a PCB 330. Antenna feed structures 340 and 345 are formed in a region above semiconductor device die 310. While FIG. 3A illustrates the antenna feed structures formed on a surface of semiconductor device package 320, alternate embodiments can provide the antenna feeds formed within a dielectric of the package and having an exposed surface, or covered with dielectric but accessible to the top surface of the semiconductor device package. These alternate embodiments can provide advantages in reducing RF power loss when transmitting from one waveguide structure formed in the package into another waveguide structure formed external to the package. Signal lines 350 and 355 are formed from contacts provided on a top surface of semiconductor device die 310 to the antenna feed structures. Signal lines 350 and 355 are formed vertically through the packaging material of semiconductor device package 320. In addition, electromagnetic shielding structures 360 and 365 can be formed around the signal lines to electrically isolate the signal lines from one another. Electromagnetic shielding structures 360 and 365 can also be used to provide contacts to waveguide structures 370 and 375 that form receive and transmit antenna arrays. Waveguide structures 370 and 375 can be mounted on both the semiconductor device package and the PCB.

Figure 3B:
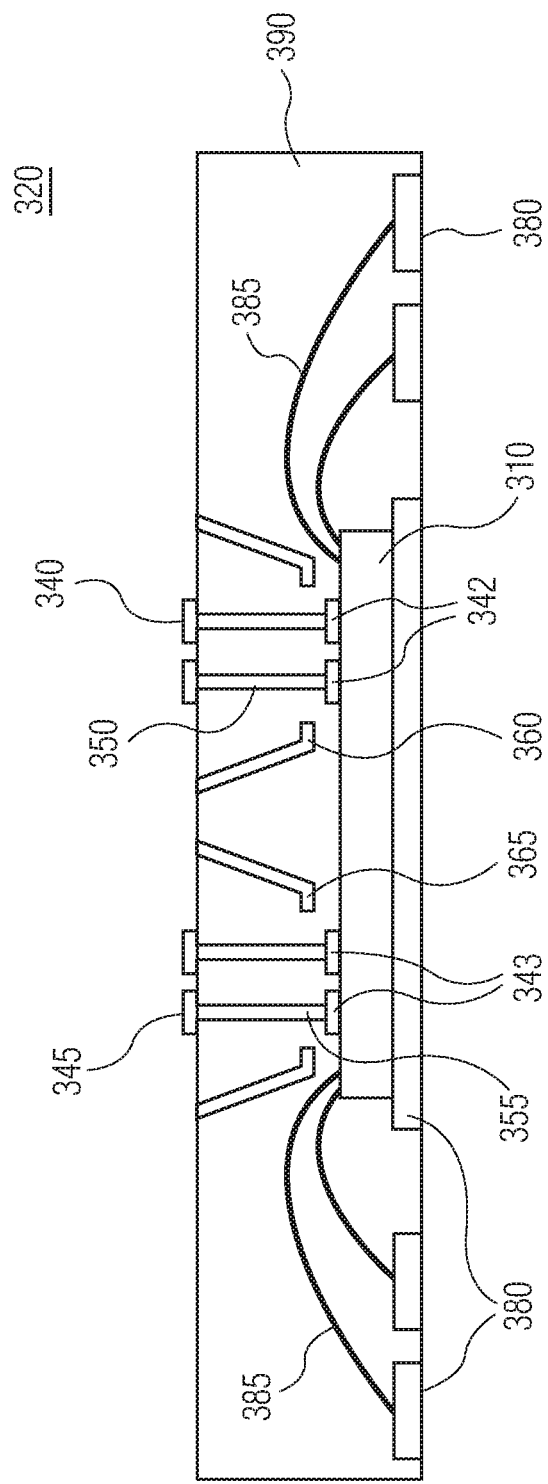
FIG. 3B is a simplified block diagram illustrating an close-up cross-section of the semiconductor device package of FIG. 3A.

FIG. 3B is a simplified block diagram illustrating an close-up cross-section of semiconductor device package 320 of FIG. 3A, in accord with one embodiment of the present invention. Semiconductor device die 310 has RF signal pads 342 and 343 on the top surface of the die. These are coupled to antenna feed structures 340 and 345 at the surface of the package via vertical signal lines 350 and 355. Electromagnetic shielding structures 360 and 365 form a shielded box around the sides and bottom of the region in which the signal lines are constructed. In one embodiment, the bottom portion of electromagnetic shielding structures 360 and 365 are about 100 µm from the top surface of semiconductor device die 310. The sides of the electromagnetic shielding structures extend about 200 µm to the top surface of package 320. The package cross section also illustrates that semiconductor device die 310 is adhesively fastened to a package lead frame 380, and that wire bonds 385 electrically couple signal pads on the perimeter of the device die to leads of the lead frame. All of these structures, with the exception of the illustrated antenna feeds, are encased in encapsulant 390. In the alternate antenna feed embodiments described above, those also can be encapsulated. Examples of how the above structures are formed are discussed in greater detail below.

Embodiments of the present invention provide a variety of processes for forming semiconductor device packages having short signal paths desired in high-frequency RF applications. Such signal paths can be formed using vertical interconnect techniques (e.g., wire bonding, additive manufacturing processes, and the like), with encapsulation and back grinding techniques resulting in optimal signal path distance, as well as shielding structures as appropriate for particular applications.

FIG. 4(A)-4(I) is a set of simplified block diagrams illustrating a first process flow for forming a high-frequency RF semiconductor package 400 with vertical interconnects in accord with one embodiment of the present invention.

Figure 4A:
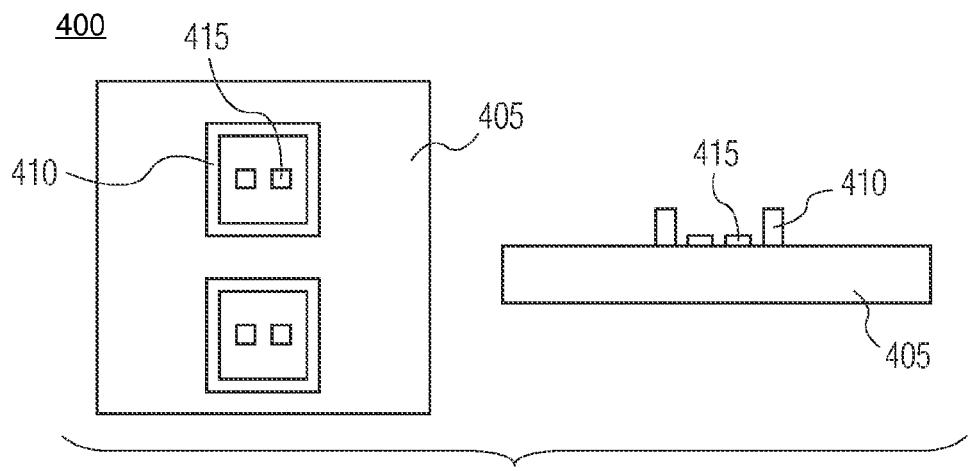
FIG. 4(A)-4(I) is a set of simplified block diagrams illustrating a first process flow for forming a high-frequency RF semiconductor package having vertical interconnects, in accord with one embodiment of the present invention.

FIG. 4(A) illustrates a semiconductor device die 405 having a mold dam box 410 formed on a top surface of the semiconductor device die around a region of the top surface including signal pads 415. Mold dam box 410 can be plated onto the top surface of the semiconductor device die while the semiconductor device die is part of a wafer prior to device die singulation. Each appropriate semiconductor device die on the wafer can receive one or more mold dam boxes surrounding signal pads, as illustrated. The dam box assists in preventing encapsulant materials from covering the signal pads and also provides a cavity in which to form vertical interconnects from the signal pads.

Figure 4B:
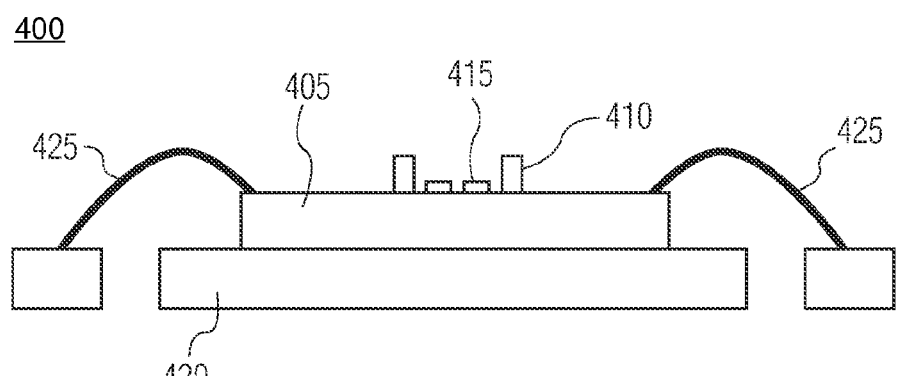
Figure 4C:
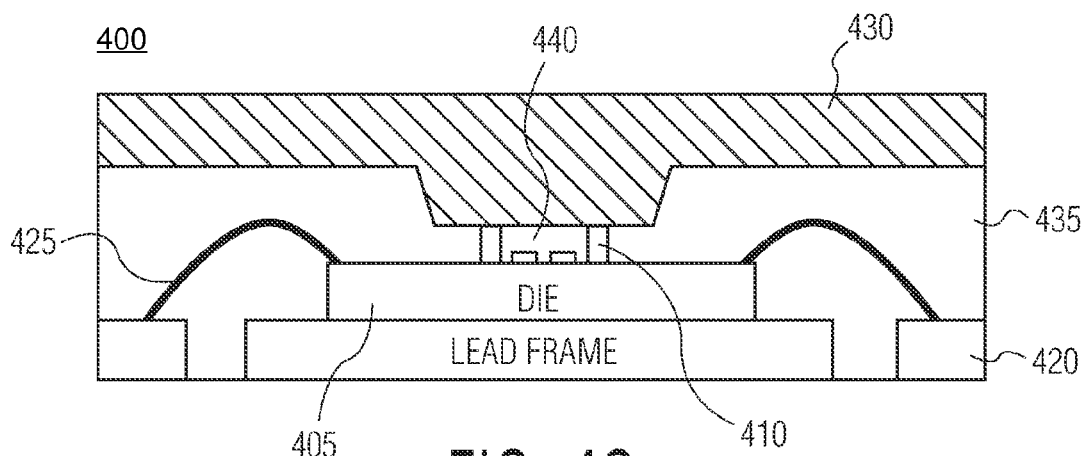

In the embodiments shown herein, semiconductor device die 405 (and those illustrated subsequently as 605 (FIGS. 6(A)-6(C)) and 705 (FIGS. 7(A) and 7(B)), by way of example) has an active side in a face-up orientation toward the top surface of the semiconductor device package being formed. The active side includes a plurality of die pads connected to active circuitry within the semiconductor device, where the perimeter die pads of semiconductor device die 405 are attached (e.g., mechanically attached and electrically connected) through wire bonds to leads on a lead frame (e.g., lead frame 420 as shown in FIGS. 4(B) and 4(C)). Signal pads 415 are connected to a signal line of active circuitry that carries a radio frequency (RF) signal. The RF signal is carried by a conductive path coupled between signal pad 415 and an antenna structure, as will be described more fully below.

Semiconductor device die 405 can be singulated from a semiconductor wafer, which can be any semiconductor material or combinations of materials, such as gallium arsenide, silicon germanium, silicon-on-insulator (SOI), silicon, monocrystalline silicon, the like, and combinations of the above. Such a semiconductor die includes active circuitry, which may include integrated circuit components that are active when the die is powered. The active circuitry is formed on the semiconductor wafer using a sequence of numerous process steps applied to semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. In some embodiments, the active circuitry may be a combination of integrated circuit components or may be another type of microelectronic device. Examples of integrated circuit components include but are not limited to a processor, memory, logic, oscillator, analog circuitry, sensor, a standalone discrete device such as a resistor, inductor, capacitor, diode, power transistor, and the like.

It is noted that in the embodiments presently described, the active circuitry of die 405 includes a radio frequency (RF) block that implements an RF transmitter, an RF receiver, or both. In embodiments, RF signals are transmitted, received, or both, via an antenna on the resulting device (e.g., waveguides 370 and 375 as shown in FIG. 3(A)) that is communicatively coupled to the active circuitry of semiconductor device die 405 (e.g., through one or more external electrical connections between signal pads 415 and a waveguide antenna feed). The RF block may implement front end components of the RF transmitter, RF receiver, or both, where the front end components may include but are not limited to a transmitter power amplifier, a receiver low noise amplifier, one or more baluns, one or more filters, a circulator or other coupling device to the antenna, impedance matching elements, an oscillator, a phase locked loop, and other appropriate front end elements. The front end components of the RF block may have configurable settings to adjust the transmit signal or receive signal. In some embodiments, the RF block may have an operating frequency that falls within a frequency band of 76 GHz to 81 GHz, although other operating frequencies that fall within other radio frequencies may be implemented in other embodiments.

FIG. 4(B) illustrates semiconductor device die 405 attached to a lead frame 420. In addition, signal contact pads along the periphery of semiconductor device die 405 are electrically coupled to leads of lead frame 420 by wire bonds 425. FIG. 4(C) illustrates semiconductor device package 400 at a subsequent stage of manufacture in which a film-assisted molding process is performed. A mold block 430 is provided over the semiconductor device die 410/lead frame 420 assembly, where the mold block 430, or a film covering mold block 430, is in contact with mold dam box 410. This forms an encapsulant region in which mold compound can be provided to form the package encapsulant. Encapsulant 435 is injected into the encapsulant region under heat and pressure until all the encapsulant material is cured. Mold dam box 410 prevents encapsulant material from forming over top surface signal pads 415 (FIG. 4(B)), leaving a cavity 440 in the region of the mold dam box.

The encapsulant material can be any appropriate encapsulant material, including, for example, silica-filled expoxy molding compounds, plastic encapsulation resins, and other polymeric materials such as silicones, polyimides, phenolics, and polyurethanes. As discussed above, once the encapsulant material is applied, the panel or strip of packages can be cured by exposing the materials to certain temperatures for a period of time, or by applying curing agents, or both, depending on the nature of the encapsulant material and the components being encapsulated. A low-loss RF characteristic is not necessary for encapsulant 435 as this encapsulant will not be part of the dielectric encasing the RF connection.

Figure 4D:
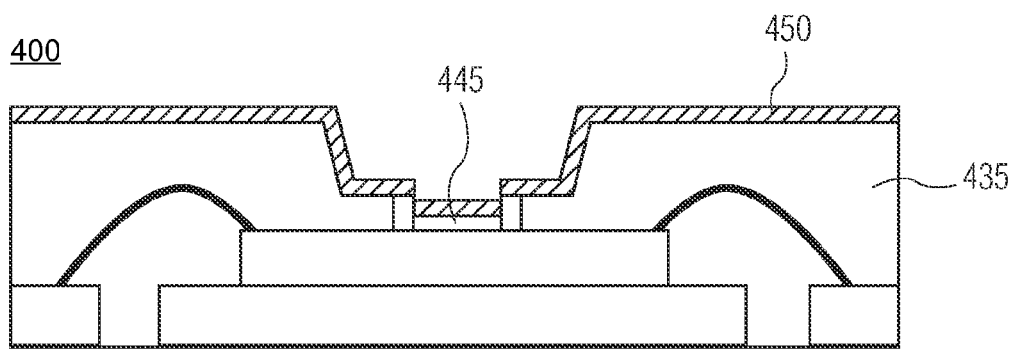
Figure 4E:
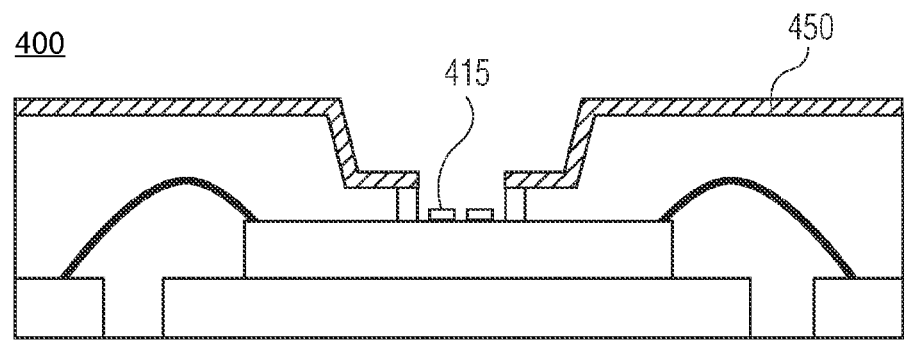

FIG. 4(D) illustrates semiconductor device package 400 at a subsequent stage of manufacture after FIG. 4(C). Mold block 430 is removed and a resist material 445 is applied to cover top surface signal pads 415 (FIG. 4(B)). A conductive layer 450 is then sputtered over the surface of encapsulant material 435 and resist material 445, and also is in contact with the conductive material of mold dam box 410. Conductive layer 450 and mold dam box 410 form a shield box in the final product, and thus the materials used for conductive layer 450 and mold dam box 410 should conform to the desired application. In one embodiment, conductive layer 450 include copper or multiple layers of copper and stainless steel. FIG. 4(E) provides a subsequent stage of manufacture after FIG. 4(C) in which the resist is removed to expose top surface signal pads on device die 405.

Figure 4F:
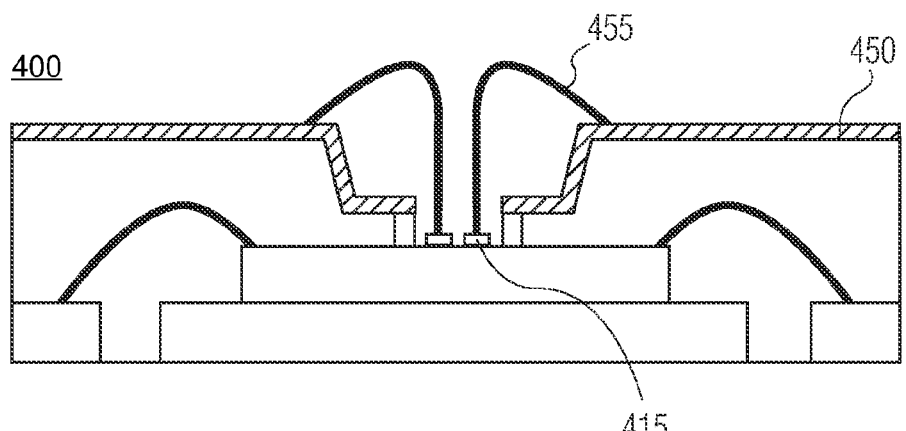

In an alternative embodiment, conductive layer 450 can be formed on the surface of encapsulant material 435 using a plating or a conductive inkjet application, rather than a sputtering method. For example, after formation of the encapsulant, a seed layer can be sputtered over the entire surface of the semiconductor device package, including the region in which top surface signal pads 415 are placed. Subsequently, the region incorporating the die pads can be covered with a resist material, and then the remaining surface of the semiconductor device package is plated with a conductive material (e.g., copper). The resist can then be removed from the top surface signal pad region, and the seed layer etched back to the signal pads, thereby exposing the top surface signal pads. This can result in a structure similar to that of FIG. 4(E), where top surface signal pads 415 are available for wire bond formation as shown in FIG. 4(F). In addition, a thicker conductive layer can be formed in this manner, which can then aid in shielding at lower frequencies.

FIG. 4(F) illustrates semiconductor device package 400 at a subsequent stage of manufacture after FIG. 4(E). A vertical interconnect 455 is formed vertically from top surface signal pads 415, rising above a top surface of conductive layer 450. The vertical interconnect can be formed using a variety of additive manufacturing techniques, including, for example, wire bonds, three-dimensional printing, and the like. A wirebond technique is used to form the vertical interconnect in FIG. 4(F). In that instance, the wirebond continues past the vertical path to connect to a point on conductive layer 450. Formation of vertical interconnect 455 is such that the conductive structure is in a region directly above the corresponding top surface signal pad at least to a height of the surface of conductive layer 450. While wire bonding is used in the illustrated examples, in alternative embodiments, the vertical portion of the interconnect above the top surface signal pads can be formed using other techniques, and embodiments of the present invention are not limited to wirebonds, but can cover a variety of techniques used to provide a continuous conductive structure formed on and above the top surface signal pads.

Figure 4G:
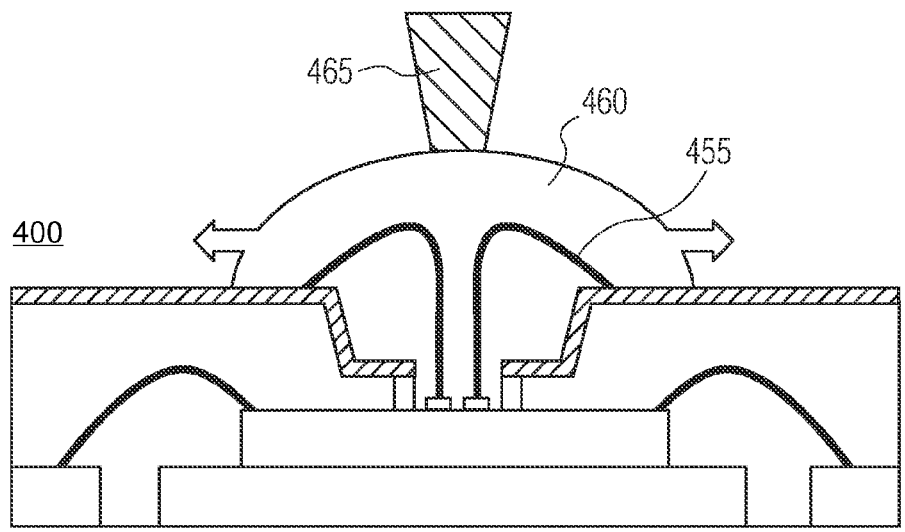

FIG. 4(G) illustrates semiconductor device package 400 at a subsequent stage of manufacture after FIG. 4(F). Encapsulant material 460 is formed in the region of the exposed vertical interconnect and over the surface of conductive layer 450. Encapsulant material 460 can be applied using a needle dispense mechanism 465. Encapsulant material 460 includes, for example, potting-type materials such as epoxy resin, thermosetting plastic, or silicone rubber, depending on the application. Encapsulant material 460 can be the same as or different from encapsulant material 435, but in general can have a low-loss RF characteristic as encapsulant material 460 is in contact with the vertical RF connection.

Figure 4H:
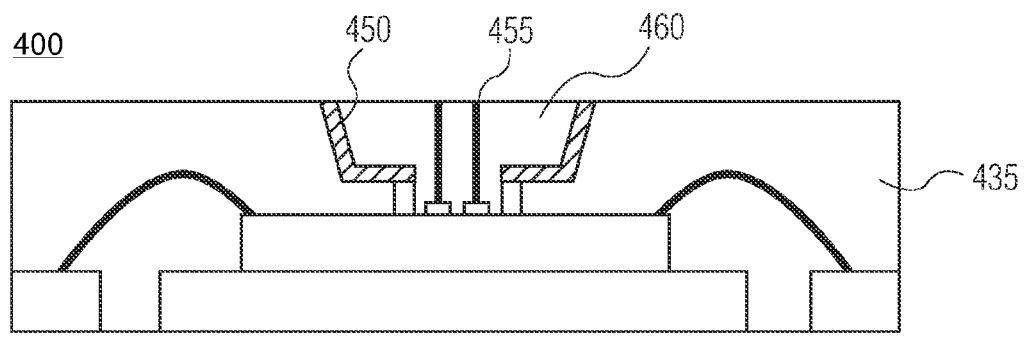

FIG. 4(H) illustrates semiconductor device package 400 at a manufacturing stage subsequent to that of FIG. 4(G). A backgrinding of the strip of semiconductor packages is performed to remove a portion of encapsulant material 460, a portion of vertical interconnects 455, and a top portion of conductive layer 450. In some embodiments, it can be desirable to remove a portion of encapsulant material 435 to reduce overall thickness of the semiconductor device package. The backgrinding forms a top major surface of the package that has exposed portions of vertical interconnect 455 and conductive layer 450. The exposed portions of vertical interconnect 455 are surrounded in encapsulant material 460, which is in turn bounded by conductive layer 450 and by mold dam box 410.

Figure 4I:
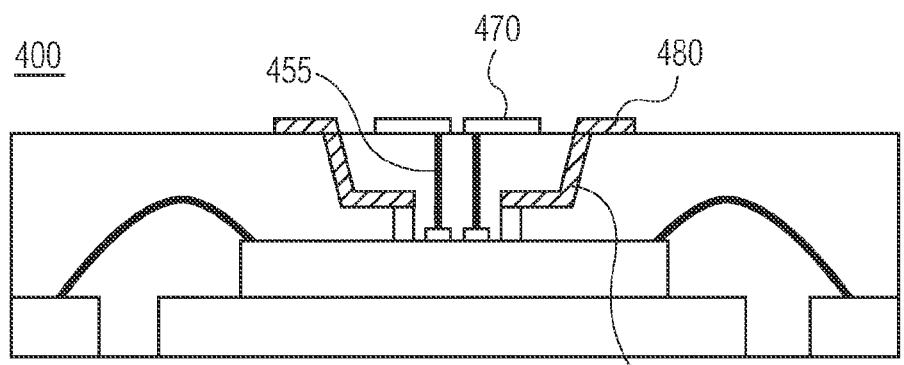

FIG. 4(I) illustrates semiconductor device package 400 at a manufacturing stage subsequent to that of FIG. 4(H). As illustrated, antenna feeds 470 and waveguide contacts 480 are formed on the top surface of semiconductor device package 400. Antenna feeds 470 are formed on encapsulant material 460 and in conductive contact with the exposed portion of vertical interconnect 455, while waveguide contacts 480 are formed in contact with the exposed portions of conductive layer 450. In one embodiment, the antenna feeds and waveguide contacts are formed by sputtering a seed layer on the top surface of semiconductor device package 400. A dry film resist can be applied to the seed layer and patterned for the antenna feed traces and waveguide contacts. The radiator traces and waveguide contacts can be plated, and then the resist removed and the seed layer etched to remove the exposed seed layer. Alternatively, the antenna feed traces and waveguide contacts can be formed using a plating or a conductive ink-jet/spray method.

Once formed, the conductive material of vertical interconnect 455 provides a path for RF signals provided by top surface signal pads 415 to antenna feeds 470. In addition, the material of conductive layer 450 provides a shield box to isolate the vertical RF interconnect. Waveguides can then be attached to the top surface of semiconductor device package 400 in the region of the antenna feeds and coupled to the waveguide contact pads. The waveguide can be attached using a conductive adhesive film. In addition, the waveguides can include a pitch converter to move the waveguides associated with the antenna feeds further apart than the pitch of the antenna feeds on the semiconductor device package.

Figure 5A:
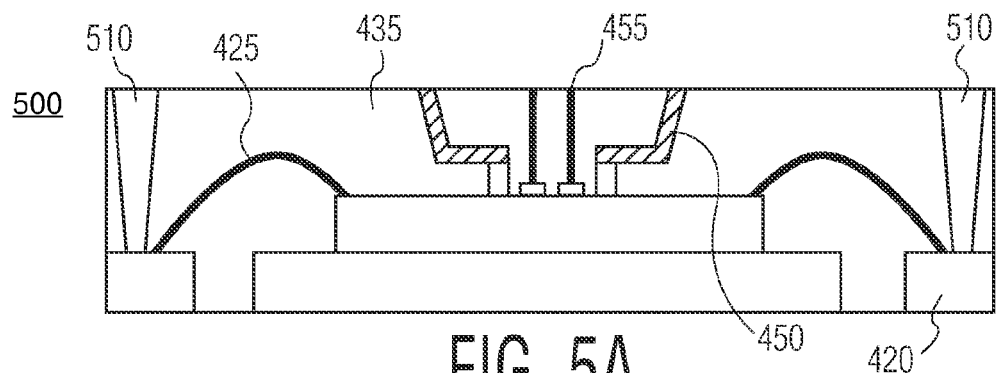
FIG. 5(A)-5(D) is a set of simplified block diagrams illustrating an alternative process flow for forming a high-frequency RF semiconductor package having vertical interconnects along with a package-level electromagnetic (EM) shield, in accord with one embodiment of the present invention.

FIG. 5(A)-5(D) is a set of simplified block diagrams illustrating an alternative process flow for forming a high-frequency RF semiconductor package 500 that includes vertical interconnects along with a package-level electromagnetic (EM) shield, in accord with one embodiment of the present invention. FIG. 5(A) illustrates semiconductor device package 500 at a manufacturing stage approximately that of FIG. 4(H). Distinguishing semiconductor package 500 at this stage from the similar stage of semiconductor package 400 is inclusion of package vias 510 drilled through encapsulant material 435 (as shown in FIGS. 4(D) and 4(H)) to provide a conductive path from the top surface of semiconductor package 500 to a contact on the lead frame. Package vias 510 can be formed at a point after formation of encapsulant material 435 (e.g., subsequent to a film-assisted molding step such as that illustrated in FIG. 4(C).

Figure 5B:
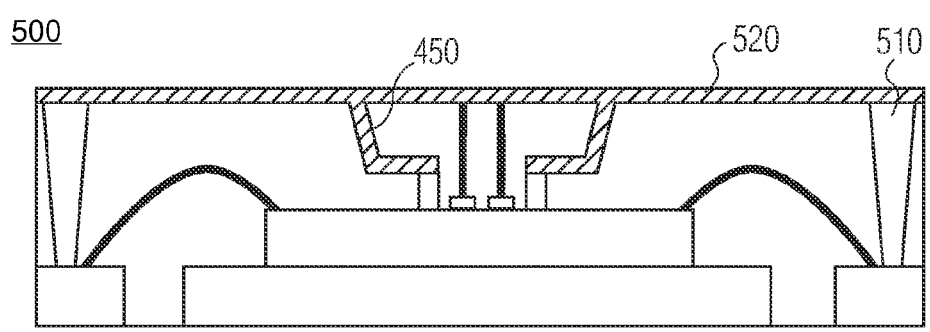

FIG. 5(B) illustrates formation of a shield layer 520 on the surface of semiconductor device package 500. Shield layer 520 is a conductive material that can be formed by, for example, a sputtering process similar to that used in forming conductive layer 450 in FIG. 4(D). In one embodiment, shield layer 520 can include copper or multiple layers of copper and stainless steel, or other conductive materials as appropriate for the application. As illustrated, conductive layer 520 is in electrical contact with conductive layer 450 and package vias 510.

Figure 5C:
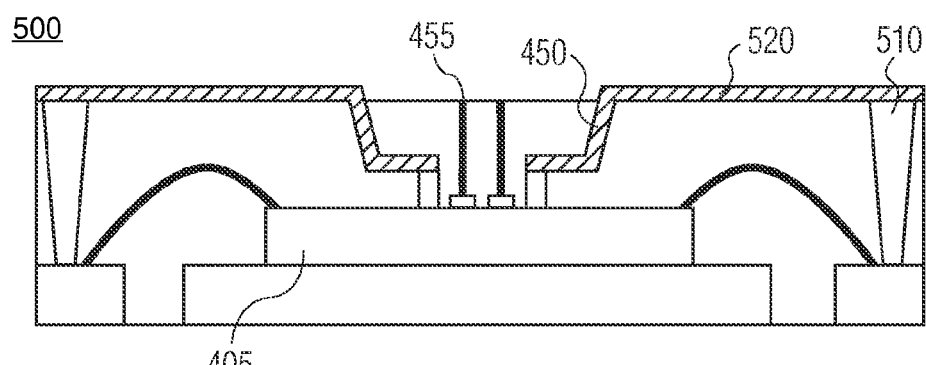

In FIG. 5(C), a portion of shield layer 520 is removed in the region surrounding and above the antenna feed contacts formed by vertical interconnect 455 coupled to the top surface signal pads of semiconductor device die 405 (as shown in FIG. 4(A)-4(C)). Removal of this material can be performed using techniques known in the art, including, for example, applying a dry film resist material over the shield layer with an opening in the antenna feed region, and then etching the shield layer material from the region not protected by the resist.

Figure 5D:
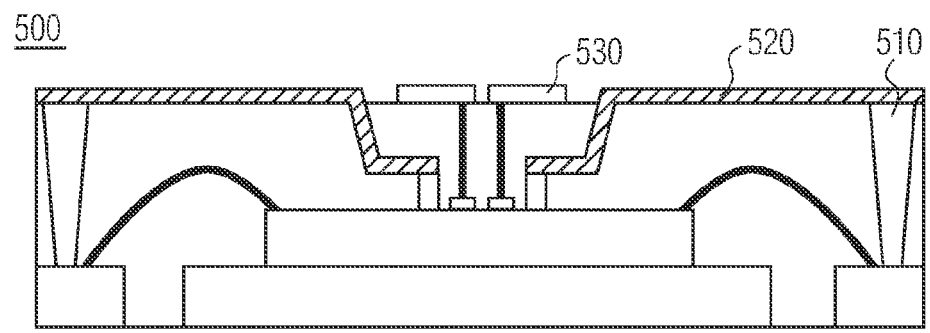

FIG. 5(D) illustrates semiconductor device package 500 after formation of radiator traces 530 at the surface of encapsulant material 450 (as shown in FIGS. 4(D)-4(F), 4(H), and 4(I)) in contact with vertical interconnect 455 in the antenna feed region. As with FIG. 4(I), antenna feed traces 530 can be formed by sputtering a seed layer, applying resist which is patterned for radiator traces, plating the radiator traces, removing the resist and etching the seed layer. Shield layer 520 can provide electromagnetic protection from high frequency signals in the antenna signal path or to other signal paths for the circuitry within semiconductor device package 500 below the shield layer.

Figure 6A:
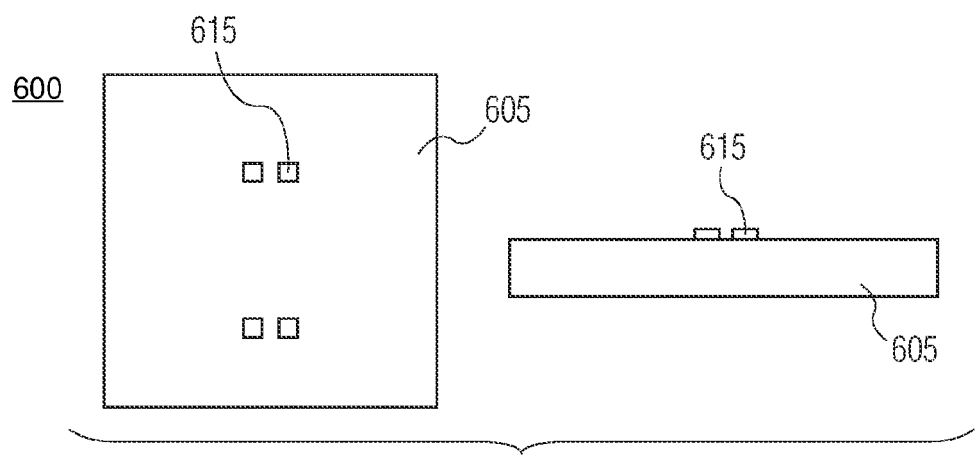
FIG. 6(A)-6(J) is a set of simplified block diagrams illustrating an alternative process flow for forming a high-frequency RF semiconductor package having vertical interconnects, in accord with one embodiment of the present invention.

FIG. 6(A)-6(J) is a set of simplified block diagrams illustrating an alternative process flow for forming a high-frequency RF semiconductor package 600 with vertical interconnects in accord with one embodiment of the present invention. FIG. 6(A) illustrates a semiconductor device die 605 including top surface signal pads 615.

Figure 6B:
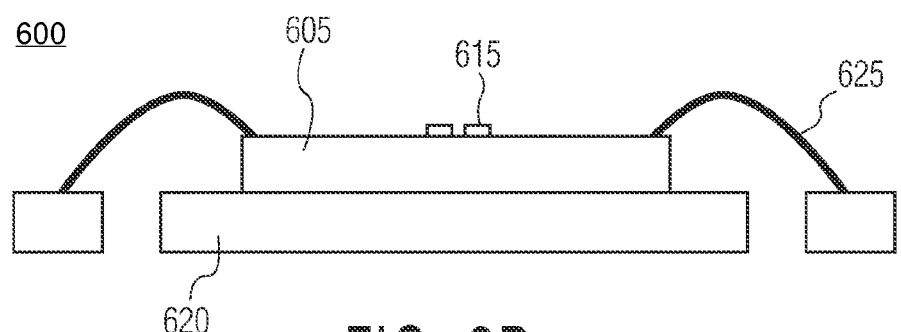

FIG. 6(B) illustrates semiconductor device die 605 attached to a lead frame 620. In addition, signal contact pads along the periphery of semiconductor device die 605 are electrically coupled to leads of lead frame 620 by wire bonds 625. FIG. 6(C) illustrates semiconductor device package 600 at a subsequent stage of manufacture where a film-assisted molding process is performed. A mold block 630 with a covering film is provided over the semiconductor device die/lead frame assembly. Encapsulant material 435 (as shown in FIGS. 4(D) and 4(H)) is then injected into a region between the mold and the semiconductor device die under heat and pressure until all the encapsulant material is cured. As illustrated, encapsulant material is formed over the entirety of semiconductor device die 605, including top surface signal pads 615.

Figure 6C:
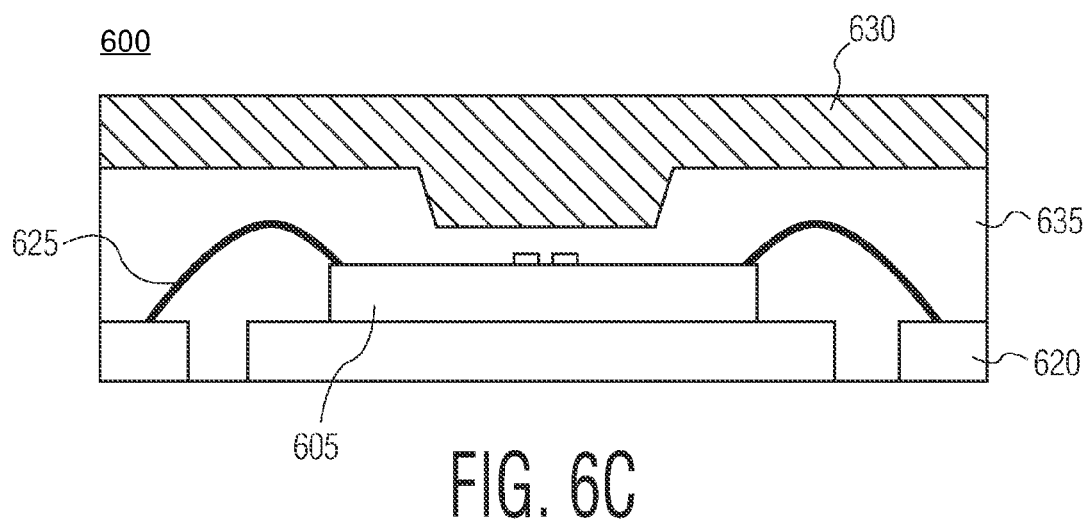
Figure 6D:
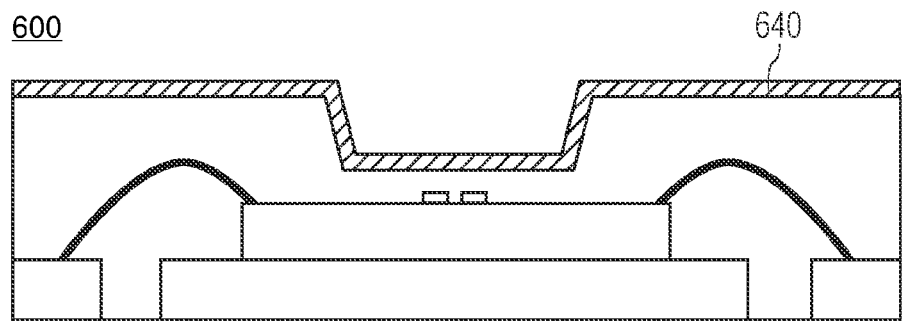
Figure 6E:
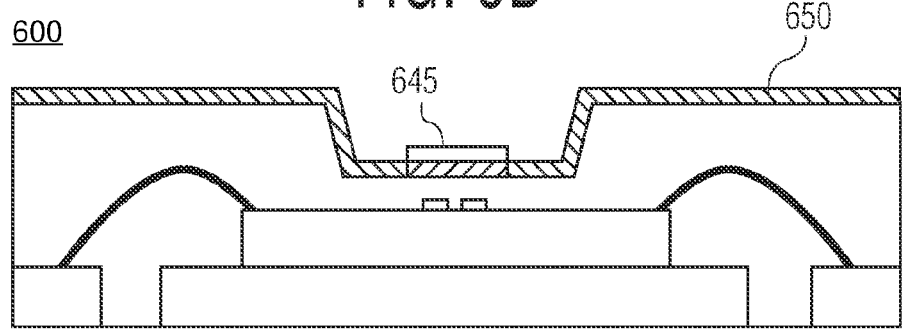
Figure 6F:
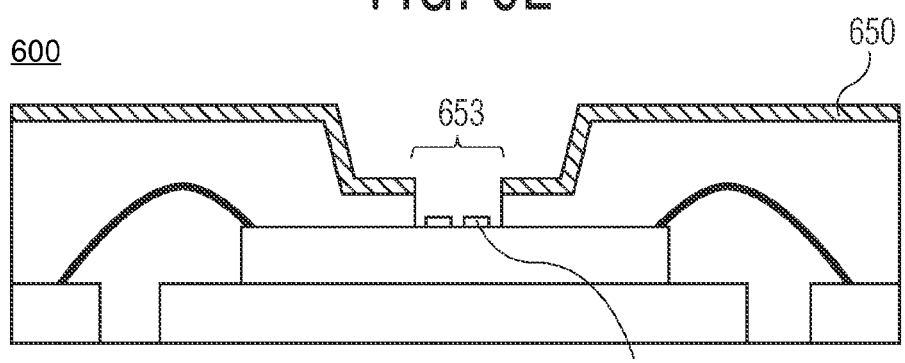

FIG. 6(D) illustrates semiconductor device package 600 at a subsequent stage of manufacture after FIG. 6(C). Mold block 630 is removed and a seed layer 640 is sputtered over the surface of encapsulant material 635. FIG. 6(E) then illustrates a subsequent stage of manufacturing where resist 645 is applied to cover the region above the top surface signal pads 615. Then the surface is plated with a conductive layer 650. Conductive layer 650 will form a shield box in the final product, and thus the materials used for conductive layer 650 should conform to the desired application. In one embodiment, conductive layer 650 includes copper or multiple layers of copper and stainless steel. FIG. 6(F) provides a subsequent stage of manufacture after FIG. 6(E) in which resist 645 is removed to expose the seed layer underneath, and then the seed layer is etched to expose the encapsulant above the top surface signal pads 615 on device die 605. Drilling can then be performed to remove the encapsulant material to expose top surface signal pads 615. One example of a drilling method is laser drilling, which can provide a high degree of precision in depth and area of the hole 653 formed through encapsulant 635 to the top of semiconductor device die 605.

Figure 6G:
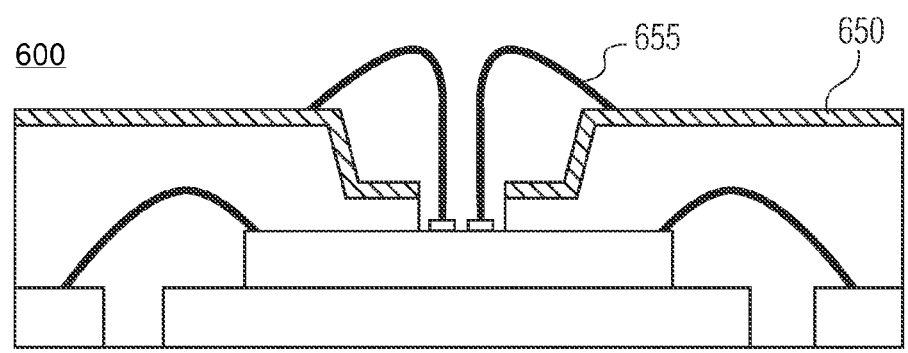

FIG. 6(G) illustrates semiconductor device package 600 at a subsequent stage of manufacture after FIG. 6(F). FIGS. 6(G)-6(J) provide similar stages of manufacture to those illustrated above in FIGS. 4(F)-4(I). Vertical interconnect 655 are formed vertically from top surface signal pads 615, rising above a top surface of conductive layer 650, and then, in the case where vertical interconnect 655 is formed by wirebonds, formed to connect to a point on conductive layer 650. Formation of vertical interconnect 655 is such that the wirebond is in a region directly above the corresponding top surface signal pad at least to a plane of the surface of conductive layer 650. As with FIG. 4(F), embodiments are not limited to vertical interconnect 655 being formed by wirebonding, and can include other types of additive manufacturing techniques.

Figure 6H:
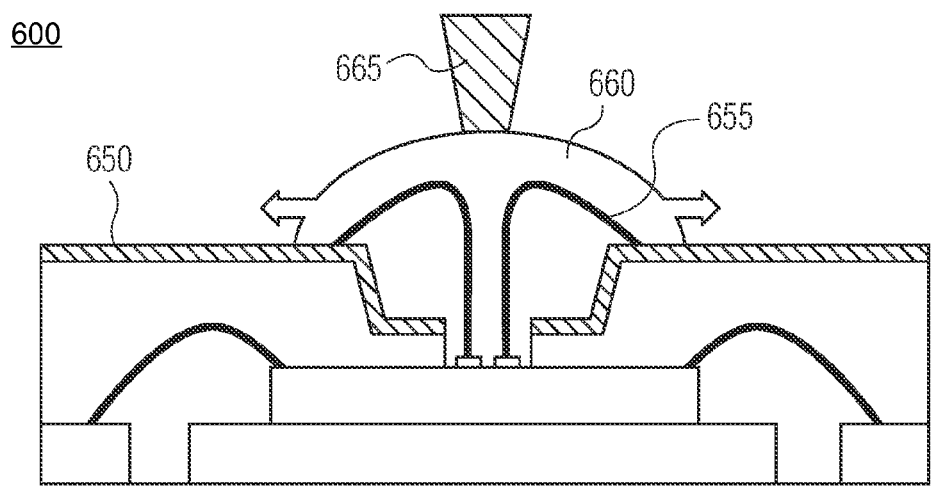

FIG. 6(H) illustrates semiconductor device package 600 at a subsequent stage of manufacture after FIG. 6(G). Encapsulant material 660 is formed in the region of the exposed vertical interconnect and over the surface of conductive layer 650. Encapsulant material 660 can be applied using a needle dispense mechanism 665. Encapsulant material 660 can include, for example, potting-type materials such as epoxy resin, thermosetting plastic, or silicone rubber, depending on the application. Encapsulant material 660 can be the same as or different from encapsulant material 635.

Figure 6I:
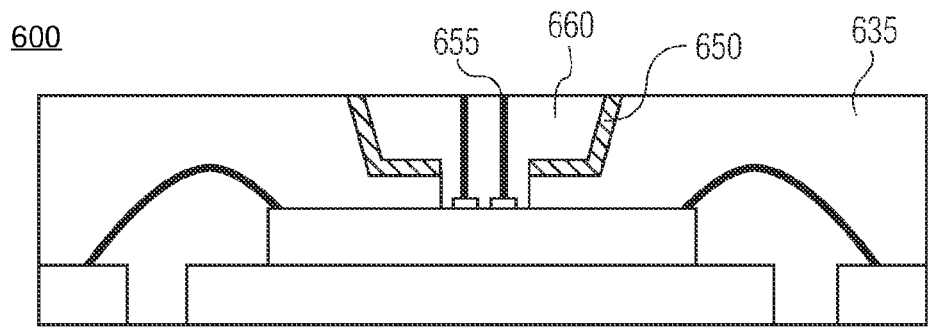

FIG. 6(I) illustrates semiconductor device package 600 at a manufacturing stage subsequent to that of FIG. 6(H). A backgrinding of the strip of semiconductor packages is performed to remove a portion of encapsulant material 660 and a top portion of conductive layer 650. The backgrinding forms a top surface of the package which has exposed a portion of vertical interconnect 655 and conductive layer 650. The exposed portions of vertical interconnects 655 are embedded in encapsulant material 660, which is in turn bounded by conductive layer 650 and hole 653.

Figure 6J:
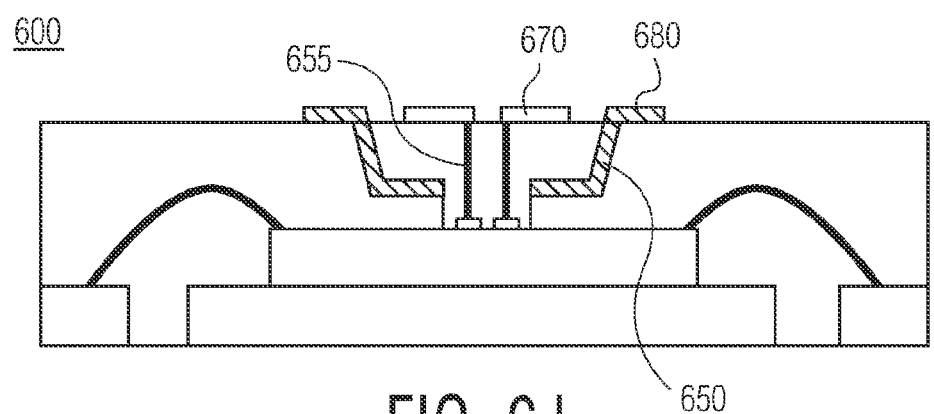

FIG. 6(J) illustrates semiconductor device package 600 at a manufacturing stage subsequent to that of FIG. 6(I). Antenna feeds 670 and waveguide contacts 680 are formed on the top surface of semiconductor device package 600. Antenna feeds 670 are formed in conductive contact with the exposed portion of vertical interconnect 655, while waveguide contacts 680 are formed on encapsulant material 660 and in conductive contact with the exposed portions of conductive layer 650. In one embodiment, the antenna feeds and waveguide contacts are formed by sputtering a seed layer on the top surface of semiconductor device package 600. A dry film resist can be applied to the seed layer and patterned for the antenna feed traces and waveguide contacts. The radiator traces and waveguide contacts can be plated, and then the resist removed and the seed layer etched to remove the exposed seed layer. Alternatively, the antenna feed traces and waveguide contacts can be formed using a plating method.

Once formed, the conductive material of vertical interconnect 655 provides a path for RF signals provided by top surface signal pads 615 to antenna feeds 670. In addition, the material of conductive layer 650 provides a shield box to isolate the vertical RF interconnect. Waveguides can then be attached to the top surface of semiconductor device package 600 in the region of the antenna feeds and coupled to the waveguide contact pads. The waveguide can be attached using a conductive adhesive film. In addition, the waveguides can include a pitch converter to move the waveguides associated with the antenna feeds further apart than the pitch of the antenna feeds on the semiconductor device package.

Figure 7A:
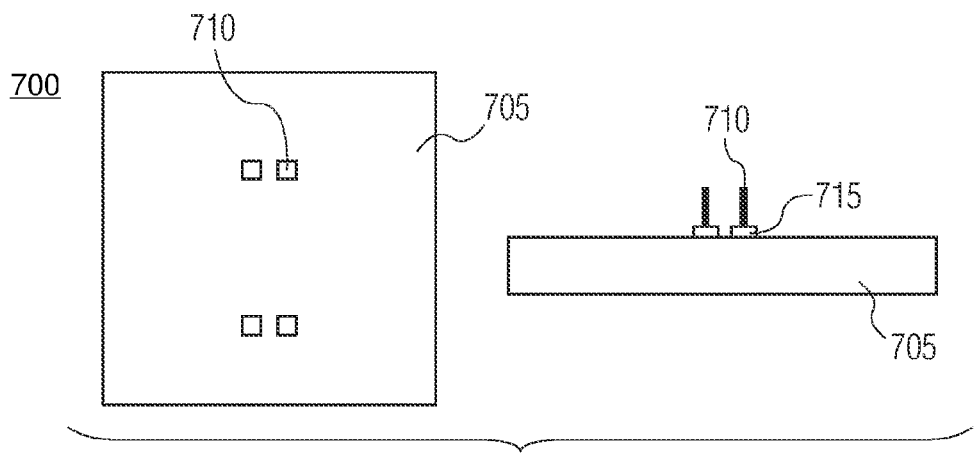
FIG. 7(A)-7(I) is a set of simplified block diagrams illustrating an alternative process flow for forming a high-frequency RF semiconductor package having vertical interconnects, in accord with one embodiment of the present invention.

FIG. 7(A)-7(I) is a set of simplified block diagrams illustrating an alternative process flow for forming a high-frequency RF semiconductor package 700 with vertical interconnects in accord with one embodiment of the present invention. FIG. 7(A) illustrates a semiconductor device die 705 including top surface signal pads 715. Unlike the previously discussed embodiment, semiconductor device die 705 has first vertical interconnects 710 plated onto the top surface signal pads while the device die is still on a wafer. These first vertical interconnects can be, for example, copper posts that rise to about 100 μm from the top surface of the semiconductor device die.

Figure 7B:
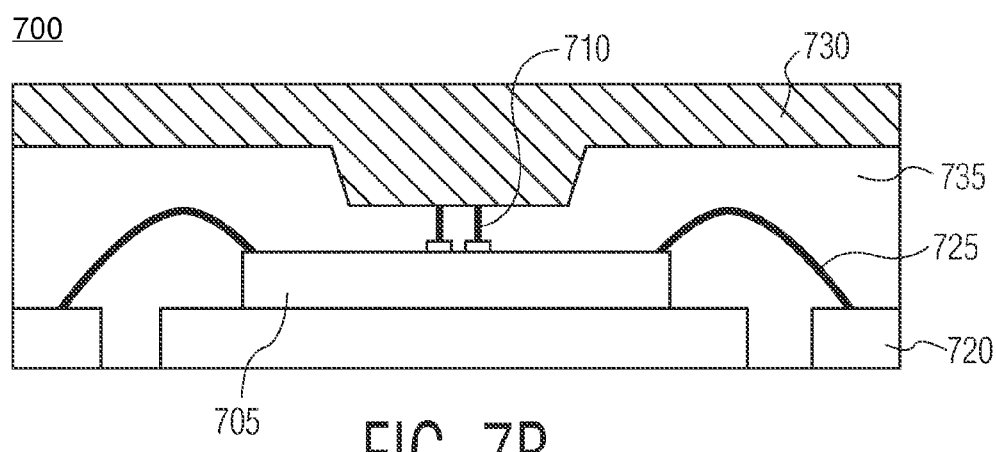

FIG. 7(B) illustrates semiconductor device die 705 attached to a lead frame 720. In addition, signal contact pads along the periphery of semiconductor device die 705 are electrically coupled to leads of lead frame 720 by wire bonds 725. FIG. 7(B) also illustrates semiconductor device package 700 undergoing a film-assisted molding process. A mold block 730 is provided over the semiconductor device die/lead frame assembly into contact with first vertical interconnects 710. Encapsulant material 735 is injected into the mold under heat and pressure until all the encapsulant material is cured. As illustrated, encapsulant material 735 is formed over the entirety of semiconductor device die 705, excluding however, the top of first vertical interconnects 710. This provides a conductive path to the top surface signal pads 715.

Figure 7C:
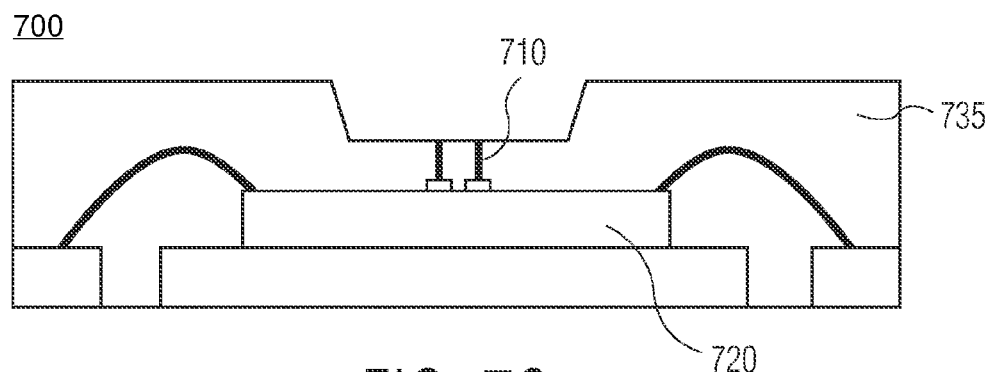
Figure 7D:
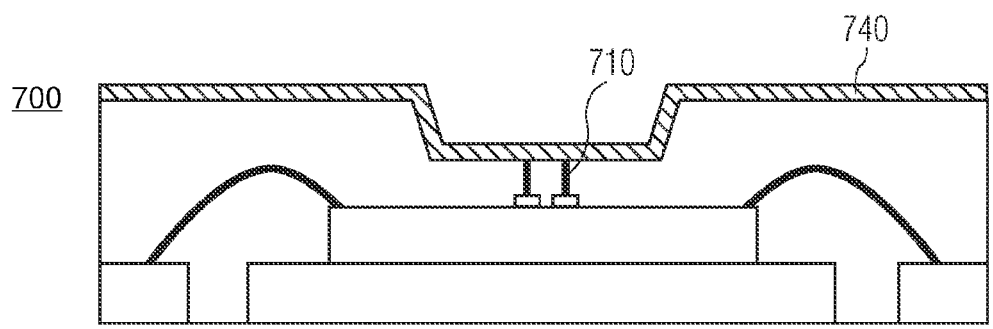
Figure 7E:
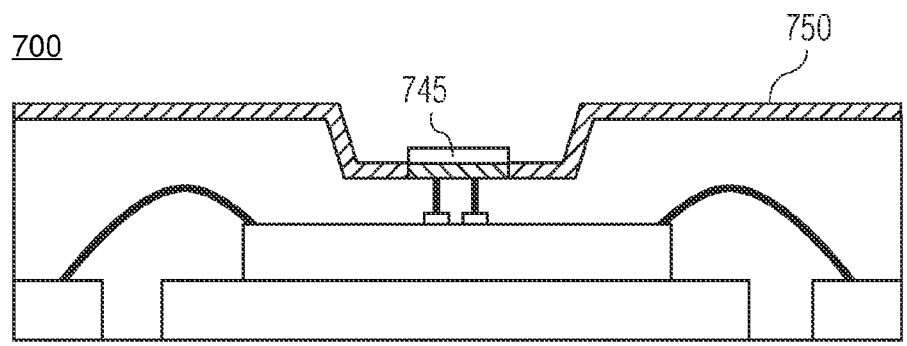

FIG. 7(C) illustrates semiconductor device package 700 at a subsequent stage of manufacture after FIG. 7(B), where mold block 730 (FIG. 7(B)) is removed. FIG. 7(D) illustrates semiconductor device package 700 at a subsequent stage of manufacture after FIG. 7(C). A seed layer 740 is sputtered over the surface of encapsulant material 735 (FIG. 7(B)). FIG. 7(E) then illustrates a subsequent stage of manufacturing where resist 745 is applied to cover the region above first vertical interconnects 710 (FIG. 7(B)). Then the surface is plated with a conductive layer 750. Conductive layer 750 will form a shield box in the final product, and thus the materials used for conductive layer 750 should conform to the desired application. In one embodiment, conductive layer 750 includes copper or multiple layers of copper and stainless steel.

Figure 7F:
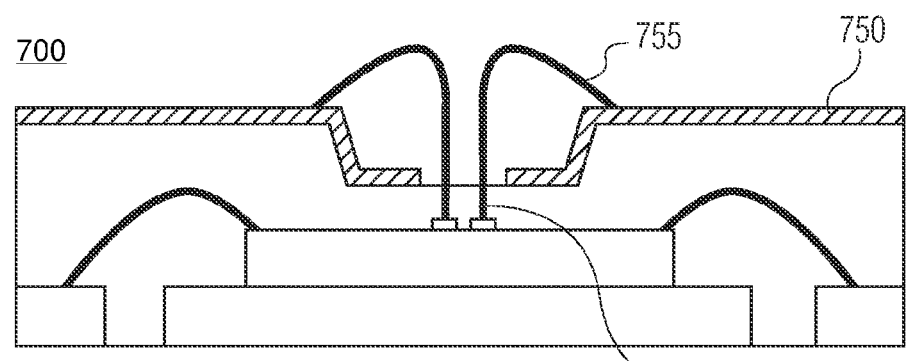

FIG. 7(F) provides a subsequent stage of manufacture after FIG. 7(E) in which the resist is removed to expose the seed layer underneath, and then the seed layer is etched to expose the encapsulant 735 in the region beneath the seed layer and a top surface of vertical interconnects 710. A second vertical interconnect 755 can then be formed vertically from the top surface of first vertical interconnects 710, rising above a top surface of conductive layer 750, and then, in a case where the second vertical interconnect is formed by wirebonds, formed to connect to a point on conductive layer 750. Formation of second vertical interconnect 755 is such that the second vertical interconnect is in a region directly above the corresponding top surface signal pad at least to a plane of the surface of conductive layer 750. An advantage of using first vertical interconnects 710, rather than directly coupling the second vertical interconnect to the top surface signal pads 715, is that there is no need to remove material down to the surface of semiconductor device die 705 (e.g., as in semiconductor device package 600) or to leave a cavity for access to the top surface of the device die (e.g., as in semiconductor device package 400). One disadvantage of this method, however, is that a material interface is added (e.g., between the vertical interconnects and the top surface signal pads, and between the first and second vertical interconnects). This added material interface can affect resistance of the signal path and therefore performance of the device.

Figure 7G:
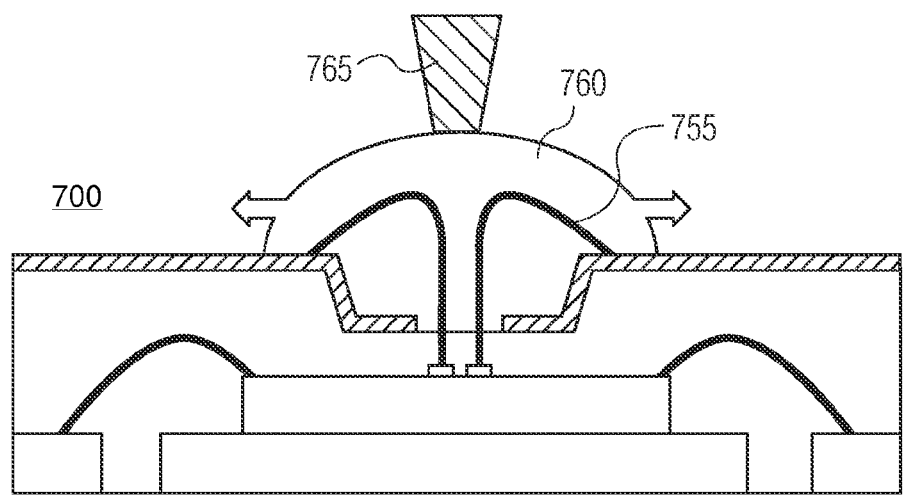
Figure 7H:
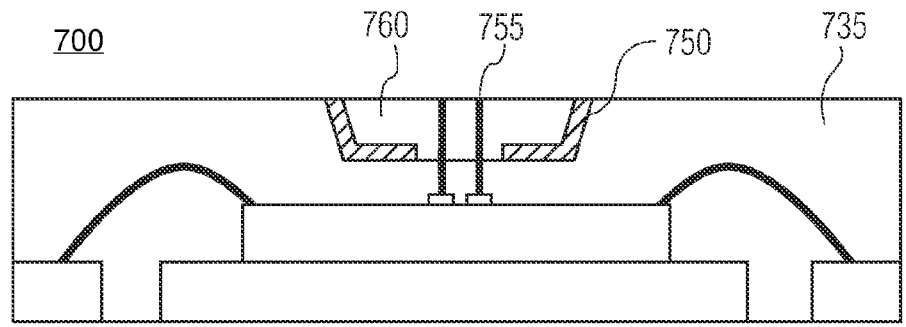
Figure 7I:
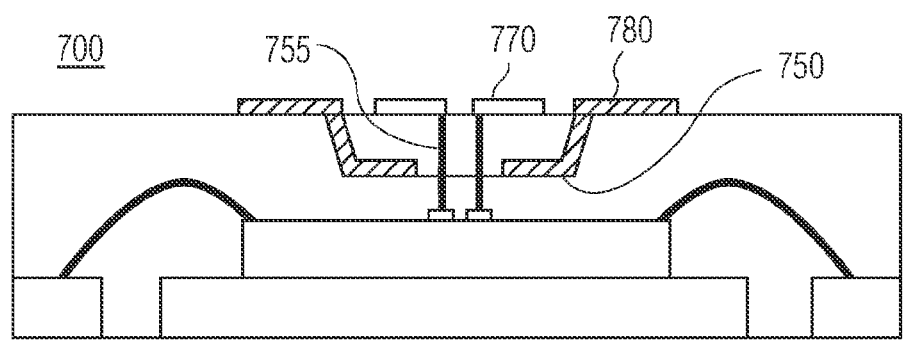

FIGS. 7(G)-7(I) provide similar stages of manufacture to those illustrated above in FIGS. 6(H)-6(J). FIG. 7(G) illustrates semiconductor device package 700 at a subsequent stage of manufacture after FIG. 7(F). Encapsulant material 760 is formed in the region of the exposed wire bonds and over the surface of conductive layer 750. Encapsulant material 760 can be applied using a needle dispense mechanism 765. Encapsulant material 760 can include, for example, potting-type materials such as epoxy resin, thermosetting plastic, or silicone rubber, depending on the application. Encapsulant material 760 can be the same as or different from encapsulant material 735.

FIG. 7(H) illustrates semiconductor device package 700 at a manufacturing stage subsequent to that of FIG. 7(G). A backgrinding of the strip of semiconductor packages is performed to remove a portion of encapsulant material 760 and a top portion of conductive layer 750. The backgrinding forms a top surface of the package which has exposed a portion of second vertical interconnects 755 and conductive layer 750. The exposed portions of second vertical interconnects 755 are embedded in encapsulant material 760, which is in turn bounded by conductive layer 750.

FIG. 7(I) illustrates semiconductor device package 700 at a manufacturing stage subsequent to that of FIG. 7(H). Antenna feeds 770 and waveguide contacts 780 are formed on the top surface of semiconductor device package 700. Antenna feeds 770 are formed on encapsulant material 760 and in contact with the exposed portion of second vertical interconnect 755, while waveguide contacts 780 are formed in contact with the exposed portions of conductive layer 750. In one embodiment, the antenna feeds and waveguide contacts are formed by sputtering a seed layer on the top surface of semiconductor device package 700. A dry film resist can be applied to the seed layer and patterned for the antenna feed traces and waveguide contacts. The radiator traces and waveguide contacts can be plated, and then the resist removed and the seed layer etched to remove the exposed seed layer. Alternatively, the antenna feed traces and waveguide contacts can be formed using a plating method.

Once formed, the conductive material of second vertical interconnect 755 along with the conductive material of vertical interconnect 710 form a combined interconnect for RF signals provided by top surface signal pads 715 to antenna feeds 770. In addition, the material of conductive layer 750 provides a shield box to isolate the vertical RF interconnect. Waveguides can then be attached to the top surface of semiconductor device package 700 in the region of the antenna feeds and coupled to the waveguide contact pads. The waveguide can be attached using a conductive adhesive film. In addition, the waveguides can include a pitch converter to move the waveguides associated with the antenna feeds further apart than the pitch of the antenna feeds on the semiconductor device package.

In an alternative embodiment to the structure shown in FIG. 7A, a mold dam, such as that illustrated in FIG. 4A, can be plated in a region around first vertical interconnects 710. As with the embodiment illustrated in FIG. 4(A)-4(I), the mold dam provides a region around the first vertical interconnects in which there is no mold compound formed during film-assisted molding. Further, the mold dam can also provide a conductive path for the shield structure to the surface of semiconductor device die 705, thereby providing a shield over the bottom portion of the first vertical interconnect.

By now it should be appreciated that there has been provided a semiconductor device package that includes a semiconductor device die having one or more RF pads on an active major surface, an encapsulant material over and around the semiconductor device die, one or more antenna feeds formed on a major surface of the encapsulant material, and a vertical interconnect coupling each RF signal pad to the corresponding antenna feed. Each antenna feed has a corresponding RF signal pad on the semiconductor device die, and at least a portion of each antenna feed is directly above the corresponding RF signal pad. The vertical interconnect includes a continuous conductor formed by additive manufacturing, and each continuous conductor is vertically disposed through the encapsulant material.

In one aspect of the above embodiment, the semiconductor device package further includes one or more waveguide contact pads on the major surface of the encapsulant material corresponding to a first antenna feed, and a first electromagnetic shield formed in the mold compound around the antenna feed, and electrically coupled to the waveguide contact pad. In a further aspect, the electromagnetic shield extends to the active major surface of the semiconductor device die. In still a further aspect, the electromagnetic shield is configured to electromagnetically isolate the vertical interconnect. In another further aspect, the semiconductor device package further includes a waveguide electrically coupled to the first waveguide contact pads, where the waveguide is adhesively coupled to the major surface of the encapsulant material, and the waveguide is communicatively coupled to the associated antenna feed.

In another aspect of the above embodiment, the vertical interconnect further includes a conductive stud vertically formed on each RF signal pad, and the continuous conductor couples the conductive stud to the antenna feed. In another aspect of the above embodiment, the semiconductor device package further includes a lead frame adhesively coupled to the in active major surface of the semiconductor device die and including one or more leads, and one or more wirebonds electrically coupling one or more other signal pads on the active major surface of the semiconductor device die to corresponding leads of the one or more leads. In still another aspect of the above embodiment, the continuous conductor includes a wirebonds.

Another embodiment provides a method for forming a semiconductor device package having one or more waveguide antenna feeds formed vertically above a semiconductor device die included in the package. The method includes coupling the semiconductor device die on a package lead frame where the semiconductor device die includes a first RF signal pad on an active major surface, forming a vertical interconnect from the first RF signal pad to a top major surface of the semiconductor device package, forming an encapsulant over and around sides of the semiconductor device die and over and around the vertical interconnect, and exposing a second end of a continuous conductor at a first major surface of the semiconductor device package. The vertical interconnect includes the continuous conductor having a first end coupled to a connection point in the vertical interconnect and extending from the connection point to at least a height equal to a final thickness of the semiconductor device package, and the continuous conductors formed using additive manufacturing techniques over the connection point.

One aspect of the above embodiment further includes forming a first electromagnetic shield structure above the semiconductor device die and around the vertical interconnect, where the electromagnetic shield structure extends to the first major surface of the semiconductor device package. In a further aspect, the forming of the encapsulant includes performing a film-assisted molding to form a surface on which the first electromagnetic shield structure is formed and a top region of the semiconductor device package, where a first encapsulant material is used for the film-assisted molding. In still a further aspect, the forming of the first electromagnetic shield structure further includes forming a conductive layer on the first encapsulant material surface. In yet a further aspect, the forming of the conductive layer includes sputtering or plating.

In another further aspect, the method further includes exposing the connection point in the vertical interconnect if the first electromagnetic shield structure or the first encapsulant material covers the connection point, and forming the continuous conductor from the connection point vertically to a height at least equal to the thickness of the semiconductor device package and subsequently forming the wirebond to couple the wirebond to the surface of the electromagnetic shield. In still a further aspect, the exposing of the second end of the continuous conductor includes forming a second encapsulant over the continuous conductor and at least a portion of the first electromagnetic shield structure, and grinding the second encapsulant, first encapsulant, a portion of the continuous conductor, and a portion of the electromagnetic shield structure to the final thickness of the semiconductor device package.

Another aspect further includes affixing a mold dam to the active major surface of the semiconductor device die where the mold dam surrounds the first RF signal pad, and performing the film-assisted molding such that the mold dam prevents encapsulant from forming over the first RF signal pad.

In another aspect of the above embodiment, the forming of the vertical interconnect includes forming a conductive stud vertically extending from the first RF signal pad where the connection point is a free end of the conductive stud. In another aspect of the above embodiment, the connection point is the first RF signal pad. Still another aspect of the above embodiment further includes forming the one or more waveguide antenna feeds on the top major surface of the semiconductor device package.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device package comprising:
   a lead frame;
   a semiconductor device die adhesively coupled by an inactive major surface of the semiconductor device die to the lead frame, the semiconductor die comprising a radio frequency (RF) signal pad on an active major surface of the semiconductor die, wherein the inactive major surface of the semiconductor device die is opposite the active major surface of the semiconductor device die;
   an encapsulant material injected over and around the semiconductor device die and the lead frame;
   a conductive shield in a mold compound formed over the encapsulant material;
   an antenna feed formed on a major surface of the encapsulant material in a cavity within the conductive shield, wherein
      the antenna feed corresponds with the RF signal pad on the semiconductor device die, and
      at least a portion of the antenna feed is directly above the RF signal pad; and
   a vertical interconnect coupling the RF signal pad to the antenna feed, wherein
      the vertical interconnect comprises a continuous conductor formed by additive manufacturing, and
      the continuous conductor is vertically disposed through the encapsulant material.

2. The semiconductor device package of claim 1 further comprising:
   a waveguide contact pad on the major surface of the encapsulant material, wherein the
   electromagnetic shield is formed around the antenna feed, and electrically coupled to the waveguide contact pad.

3. The semiconductor device package of claim 2 wherein the electromagnetic shield extends to the active major surface of the semiconductor device die.

4. The semiconductor device package of claim 3 wherein the electromagnetic shield is configured to provide electromagnetic isolation to the vertical interconnect.

5. The semiconductor device package of claim 3 further comprising:
   a waveguide electrically coupled to the waveguide contact pad, wherein
      the waveguide is adhesively coupled to the major surface of the encapsulant material, and
      the waveguide is communicatively coupled to the antenna feed.

6. The semiconductor device package of claim 1 wherein the vertical interconnect further comprises:
   a conductive stud vertically formed on the RF signal pad; and
   the continuous conductor couples the conductive stud to the antenna feed.

7. The semiconductor device package of claim 1 wherein:
   the lead frame comprises one or more leads; and
   the semiconductor device package further comprises one or more wirebonds electrically coupling one or more other signal pads on the active major surface of the semiconductor device die to corresponding leads of the one or more leads.

8. The semiconductor device package of claim 1 wherein the continuous conductor comprises a wirebond.

9. A method for forming a semiconductor device package having a waveguide antenna feed formed vertically above a semiconductor device die comprised in the package, the method comprising:
   coupling an inactive major surface of the semiconductor device die onto a package lead frame, wherein the semiconductor device die comprises a radio frequency (RF) signal pad on an active major surface of the semiconductor device die, and wherein the inactive major surface of the semiconductor device die is opposite the active major surface of the semiconductor device die;
   forming a vertical interconnect from the RF signal pad to a top major surface of the semiconductor device package, wherein
      the vertical interconnect comprises a continuous conductor having a first end coupled to the RF signal pad and extending from a connection point in the vertical interconnect to at least a height equal to a final thickness of the semiconductor device package, and
      the continuous conductor is formed using additive manufacturing techniques over the connection point;
   injecting an encapsulant over and around sides of the semiconductor device die and over and around the vertical interconnect;
   forming a conductive shield structure over the encapsulant, the conductive shield structure having a cavity over the RF signal pad; and
   exposing a second end of the continuous conductor at the top major surface of the semiconductor device package.

10. The method of claim 9 further comprising:
    forming an electromagnetic shield structure above the semiconductor device die and around the vertical interconnect, wherein the electromagnetic shield structure extends to the top major surface of the semiconductor device package.

11. The method of claim 10 wherein said injecting the encapsulant comprises:
    injecting a film assisted molding to form a surface on which the electromagnetic shield structure is formed, wherein a first encapsulant material is used for the film assisted molding.

12. The method of claim 11 wherein forming the electromagnetic shield structure further comprises:
    forming a conductive layer on a surface of the first encapsulant material.

13. The method of claim 12 wherein said forming the conductive layer comprises sputtering or plating.

14. The method of claim 12 further comprising:
    exposing the connection point in the vertical interconnect if the electromagnetic shield structure or the first encapsulant material covers the connection point; and forming the continuous conductor from the connection point vertically to a height at least equal to the final thickness of the semiconductor device package and subsequently forming a wirebond to couple the continuous conductor to a surface of the electromagnetic shield structure.

15. The method of claim 14 wherein said exposing the second end of the continuous conductor comprises:
   forming a second encapsulant over the continuous conductor and at least a portion of the electromagnetic shield structure; and
   grinding the second encapsulant, first encapsulant, a portion of the continuous conductor, and a portion of the electromagnetic shield structure to form the final thickness of the semiconductor device package.

16. The method of claim 11 further comprising:
   affixing a mold dam to the active major surface of the semiconductor device die, wherein the mold dam surrounds the RF signal pad; and
   performing the film assisted molding such that the mold dam prevents encapsulant from forming over the RF signal pad.

17. The method of claim 9 wherein said forming the vertical interconnect comprises:
   forming a conductive stud vertically extending from the RF signal pad, wherein the connection point is a free end of the conductive stud.

18. The method of claim 9 wherein the connection point is the RF signal pad.

19. The method of claim 9 further comprising:
   forming the one or more waveguide antenna feeds on the top major surface of the semiconductor device package.

20. A semiconductor device package comprising:
   a lead frame;
   a semiconductor device die adhesively coupled by an inactive major surface of the semiconductor device die to the lead frame, the semiconductor die comprising a radio frequency (RF) signal pad on an active major surface of the semiconductor die, wherein the inactive major surface of the semiconductor device die is opposite the active major surface of the semiconductor device die;
   an encapsulant material injected over and around the semiconductor device die and the lead frame;
   an antenna feed formed on a major surface of the encapsulant material, wherein the antenna feed corresponds with the RF signal pad on the semiconductor device die, and at least a portion of the antenna feed is directly above the RF signal pad; and
   a vertical interconnect coupling the RF signal pad to the antenna feed, wherein the vertical interconnect comprises a wirebond conductor bonded to the RF signal pad.

* * * * *